United States Patent
Chu et al.

(10) Patent No.: US 7,187,070 B2
(45) Date of Patent: Mar. 6, 2007

(54) STACKED PACKAGE MODULE

(75) Inventors: Chi Chih Chu, Kaohsiung (TW);
Cheng-Yin Lee, Tainan (TW);
Gwo-Liang Weng, Kaohsiung (TW);
Shih-Chang Lee, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 73 days.

(21) Appl. No.: 10/934,409

(22) Filed: Sep. 7, 2004

(65) Prior Publication Data
US 2005/0082656 A1    Apr. 21, 2005

(30) Foreign Application Priority Data
Sep. 8, 2003    (TW) ................ 92124790 A

(51) Int. Cl.
*H01L 23/02*    (2006.01)
(52) U.S. Cl. ...................... 257/686; 257/777
(58) Field of Classification Search ................ 257/686, 257/777, 724, 734
See application file for complete search history.

(56) References Cited

U.S. PATENT DOCUMENTS

| | | | |
|---|---|---|---|
| 6,291,897 B1 * | 9/2001 | Wark et al. ................. | 257/786 |
| 6,700,783 B1 | 3/2004 | Liu et al. | |
| 6,870,248 B1 * | 3/2005 | Shibata ....................... | 257/686 |
| 6,876,074 B2 * | 4/2005 | Kim ............................ | 257/686 |
| 2002/0140107 A1 * | 10/2002 | Kato et al. ................... | 257/777 |
| 2003/0042589 A1 * | 3/2003 | Hong ........................... | 257/686 |
| 2003/0057552 A1 * | 3/2003 | Kainuma et al. ............ | 257/737 |
| 2004/0124520 A1 * | 7/2004 | Rinne ........................... | 257/686 |
| 2004/0155326 A1 * | 8/2004 | Kanbayashi ................. | 257/686 |
| 2004/0212098 A1 * | 10/2004 | Pendse ......................... | 257/778 |

FOREIGN PATENT DOCUMENTS

TW    527018    4/2003

* cited by examiner

*Primary Examiner*—Nathan W. Ha
(74) *Attorney, Agent, or Firm*—Bacon & Thomas, PLLC

(57) ABSTRACT

A Stackable package module comprises a plurality of semiconductor devices in stack. One of the semiconductor devices includes a chip with an active surface and a corresponding back surface, a plurality of solder bumps and a plurality of stud bumps. The solder bumps are formed on the active surface. The stud bumps are formed on the back surface. Each stud bump has a bump body and a protruding trail by wire-bonding and cutting. Bumps of another package are bonded on the stub bumps for replacing known intermediate substrate in conventional stacked package module.

16 Claims, 4 Drawing Sheets

STACKED PACKAGE MODULE

BACKGROUND OF THE INVENTION

1. Field of Invention

This invention relates to a semiconductor package module. More particularly, the present invention is related to a stacked package module.

2. Related Art

A well-known stacked package module employs a plurality of chips stacked with each other in a vertical direction so as to have the thickness of the package module smaller and smaller. As a package module disclosed in TW Pat. 527018, it illustrates that the external terminals, such as solder balls and leads, for connecting the packages with each other are disposed at the periphery of the carrier. It is easy to rework to reach the reliability requirement of package units, but the external terminals of the package units are not easy to align with each other so as to lower the reliability of the package module.

Moreover, another well-known package module as shown in FIG. 1 employs an intermediate substrate 30 formed between a first package 10 and a second package 20 to electrically connect the first package 10 and the second package 20 with each other. Therein, the second package 20 is located over the first package 10; the first package 10 has a chip 11 with bumps 12 formed thereon and a carrier 13 with solder balls 14 formed thereon wherein the chip 11 is attached to the carrier 13 through the bumps 12. To be noted, the intermediate substrate 30 has an opening 32 and a plurality of electrically conductive traces 31 formed therein to electrically connect the contacts 34, for electrically connecting the first package 10 and the second package 20, formed on the upper surface of the intermediate substrate 30 and the bumps 33 formed on the lower surface of the intermediate substrate 30. Because the size of the opening 32 shall be applicable to the size of the chip 11 for accommodating the chip 11 therein, the carrier 13 for carrying the chip 11 shall be designed upon the size of the chip 11, namely, the carrier 13 shall be designed according to the size of the opening 32. In addition, the intermediate substrate 30 has an opening 32 formed therein, accordingly, the stiffness of the intermediate substrate 30 becomes lower than that without opening formed therein so that such intermediate substrate 30 is easily to be warped. Hence, the bumps 21 and 33 are easily to be damaged due to the warpage of the intermediate substrate 30. On the basis, usually, the thickness and the warpage of the intermediate substrate 30 are required to be restricted to a limitation so as to prevent the bumps 21 and 33 from being damaged. This is the key and critical point to be resolved when such stacked package module is employed as an electronic component in an electronic application.

Therefore, providing another stacked package module to solve the mentioned-above disadvantages is the most important task in this invention.

SUMMARY OF THE INVENTION

In view of the above-mentioned problems, this invention is to provide a stacked package module with a first chip flip-chip bonded to a back surface of a second chip by employing stud bumps formed on the back surface and a circuits layer connected to the stud bumps, wherein the circuits layer formed on the back surface of the second chip and extended along a side surface to an active surface of the second chip so as to have the first chip electrically connected to the second chip without using an intermediate substrate for electrically connecting the first chip and the second chip. Hence, the thickness of the stacked package module will become smaller and smaller and the manufacture cost will be saved.

To achieve these and other advantages and in accordance with the purpose of the invention, as embodied and broadly described herein, the invention specifically provides a stacked package module wherein the stacked package module mainly comprises a first chip, a second chip, a plurality of stud bumps and a circuits layer formed on the first chip so as to electrically connect the first chip, the second chip through the stud bumps and the circuits layer. To be noted, the first chip has a first active surface, a first back surface and a first side surface connecting the first active surface and the first back surface; the circuits layer is formed on the first back surface, extended along the first side surface to the first active surface; and the stud bumps are formed on the first back surface and connected to the circuits layer. In addition, one of the stud bumps has a bump body and a trail protruded from the bump body. Optionally, there are further solder bumps formed on the second active surface of the second chip and encapsulate the stud bumps respectively so as to have the first chip and the second chip securely attached with each other.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
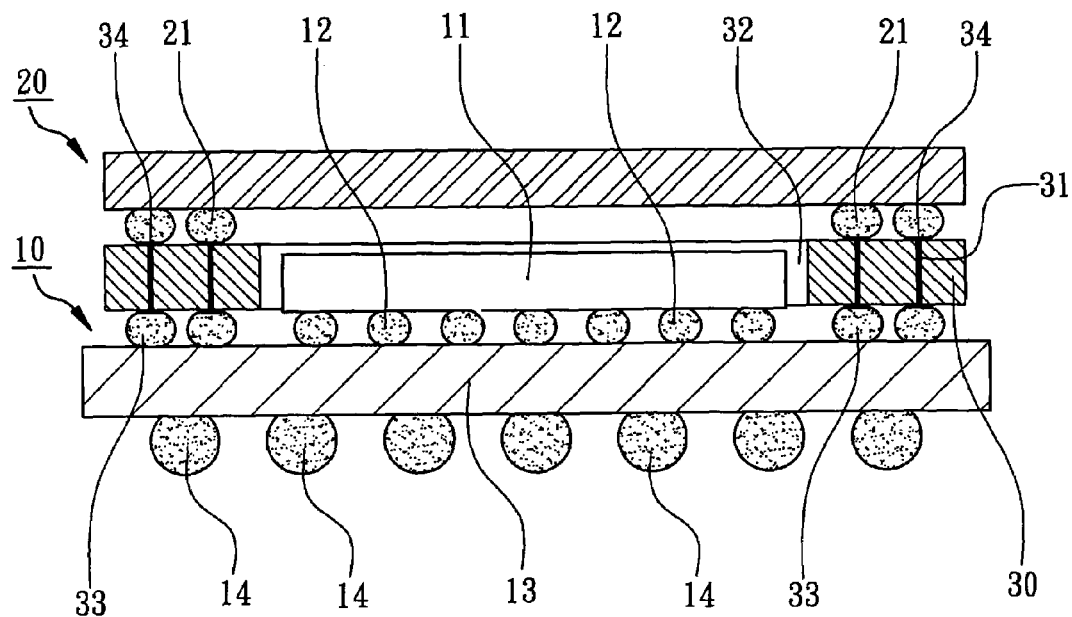
FIG. 1 is a cross-sectional view of a conventional stacked package module with an intermediate substrate formed therein.
Figure 2:
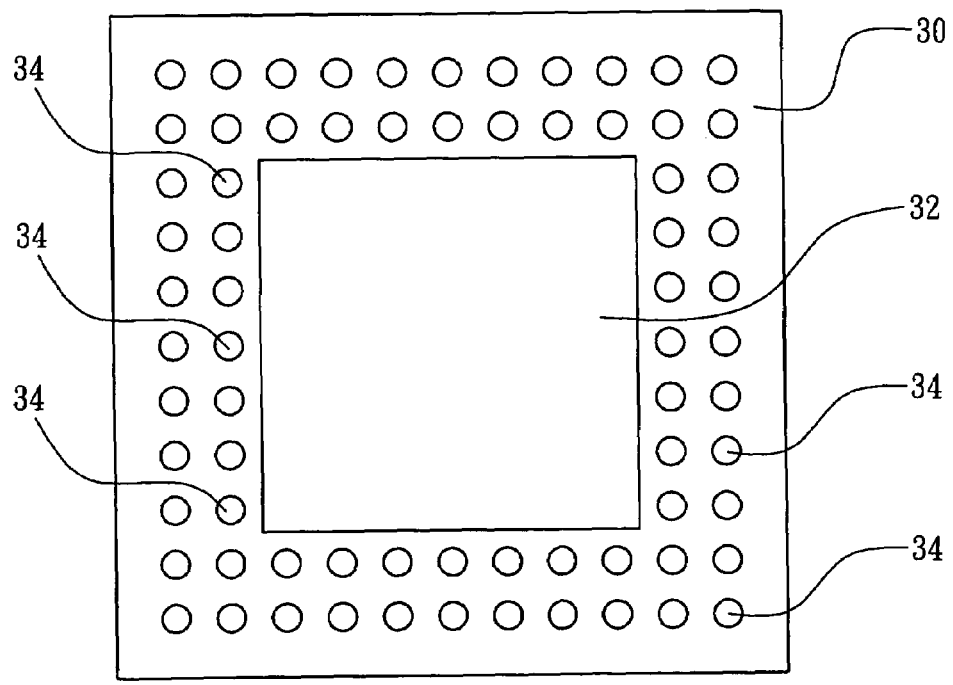
FIG. 2 is a top view of the intermediate substrate of the stacked package module as shown in FIG. 1.

The stacked package module according to the preferred embodiments of this invention will be described herein below with reference to the accompanying drawings, wherein the same reference numbers are used in the drawings and the description to refer to the same or like parts.

Figure 3:
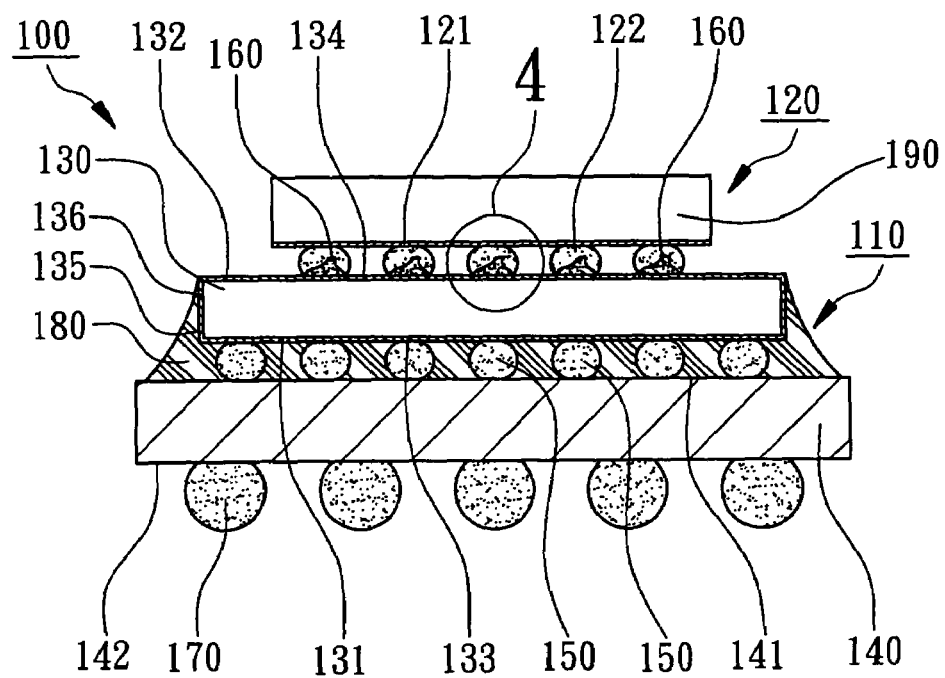
FIG. 3 is a cross-sectional view of a stacked package module according to the preferred embodiment of the present invention.

As shown in FIG. 3, it illustrates a first embodiment of this invention. The stacked package module 100 mainly comprises a first package 110 and a second package 120.

Therein, the second package 120 is disposed over the first package 110 in the vertical direction. The first package 110 can be a ball grid array package, a chip scale package, a quad flat non-leaded package or a flip chip package. In this embodiment, the first package 110 mainly has a first chip 130 and a substrate 140. Therein, the first chip 130 has a first active surface 131 and a first back surface 132 opposing to the first active surface 131. In addition, there is a first circuits layer 133 formed on the first active surface 131 and there are also first bumps 150, such as solder bumps, copper bumps and gold bumps, formed on the first active surface 131. Moreover, there are second circuits layer 134 formed on the first back surface 132 for connecting to the stud bumps 160. Therein, the first circuits layer 133 and the second circuits layer 134 are able to be formed by the methods of sputter, development, and etching. In addition, there is a side circuits layer 135 formed on a side surface 136 of the first chip 130 so as to connect the first circuits layer 133 and the second circuits layer 134. Namely, there is a circuits layer 133 formed on the first back surface 132, extended along the side surface 136 to the first active surface 131. Besides, the first bumps 150 are electrically connected to the substrate 140. Preferably, there is an encapsulation 180, such as an underfill, disposed between the first chip 130 and the substrate 140 and encapsulating the first bumps 150 so as to protect the first bumps 150 well from being damaged. Usually, the first back surface 132 is exposed out of the encapsulation 180. Furthermore, the encapsulation 180 is formed by the method of transfer molding. In other words, the encapsulation 180 is made of a molding compound.

Figure 4:
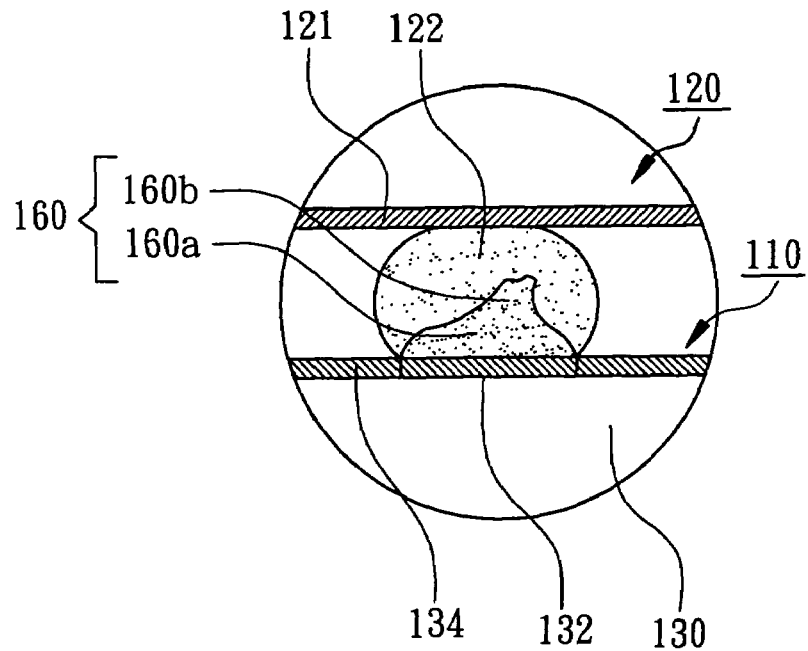
FIG. 4 is a schematic diagram showing a stud bump formed on a back surface of a chip of FIG. 3.

As mentioned above, the stud bumps 160 are formed on the first back surface 132 by wire-bonding method. However, each stud bump 160 has a bump body 160a and a trail 160b, as shown in FIG. 4, protruded from the bump body 160a by cutting the wires when the wire-bonder moves upwardly to complete the stud bump 160. General speaking, the stud bump 160 is a gold bump.

Moreover, the second package 120 is a smaller package, such as a ball-grid-array package, a flip-chip package, a flip chip package and a quad flat non-leaded package and is attached to the first package 110 through the stud bumps 160. In this embodiment, the first package 110 is a package with a processor therein and the second package 120 is a memory package. The second package 120 has a second chip 190, a circuits layer 121 and second bumps 122 attached to the circuits layer 121. When the second package 120 is attached to the first package 110 through the second bumps 122 and the stud bumps 160, the second bumps 122 are stacked on the stud bumps 160 respectively. When the second bumps 122 are solder bumps and the stud bumps 160 are gold bumps or copper bumps, the second bumps 122 will encapsulate the stud bumps 160 due to the melting point of the stud bumps 160 are higher than that of the second bumps 122 after the second bumps 122 are reflowed to securely attached to the stud bumps 160.

Figure 5:
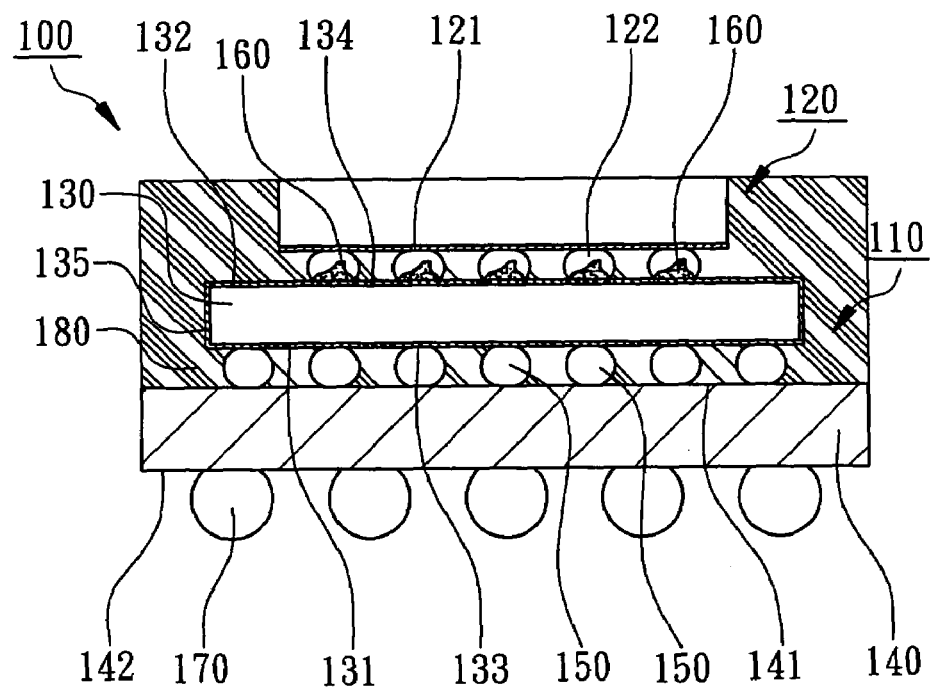
FIG. 5 is a cross-sectional view of a stacked package module according to another preferred embodiment of the present invention with a chip exposed out of an encapsulation.
Figure 6:
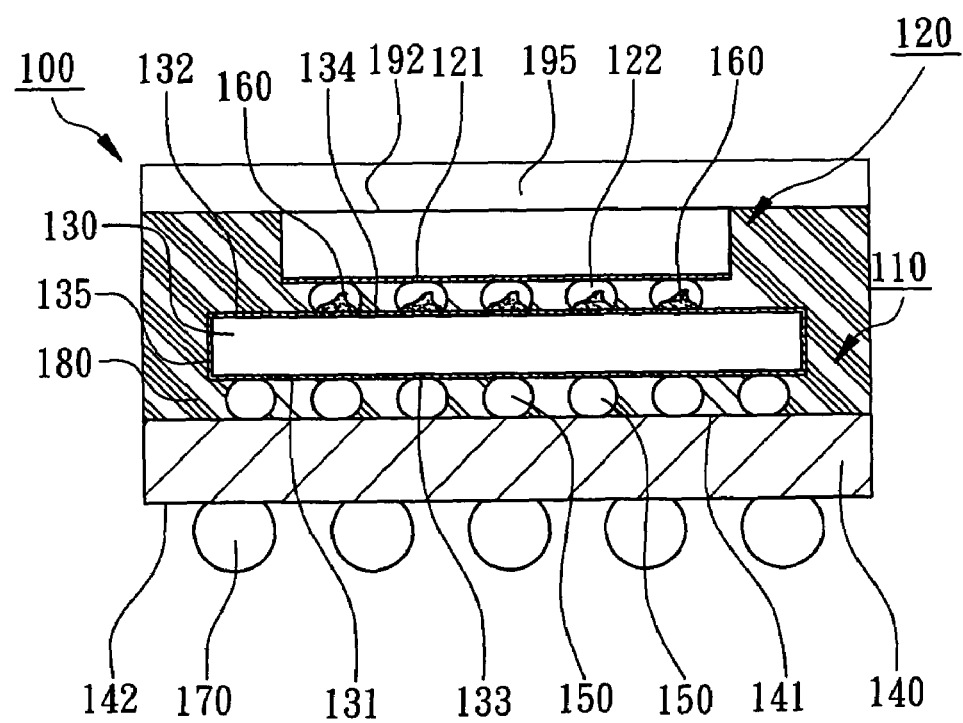
FIG. 6 is a cross-sectional view of a stacked package module according to another preferred embodiment of the present invention with a heat sink formed therein.

As mentioned above, accordingly, in the stacked package module 100, the first back surface 132 of the first chip 130 of the first package 110 is exposed for providing a plurality of stud bumps 160 formed thereon for being connected to the second bumps 122 of the second chip 190. Hence, the conventional intermediate substrate 30 as shown in FIG. 1 is replaced so that the stacked package module has a smaller thickness. Consequently, the stud bumps 160 are not only utilized for replacing the conventional intermediate substrate 30 but also can enhance the attachment of the second bumps 122 to the first chip 130. In addition, there is provided a flux or a patterned pre-solder on the first back surface 132 of the first chip 130 so as to enhance the attachment of the second bumps 122 to the stud bumps 160. Usually, a per-solder, such as eutectic solder (the ratio of lead to tin is 37 to 63) and high lead solder (the ratio of lead to tin is 95 to 5) with a melting point being lower than that of the stud bump. In addition, in order to protect the first bumps 150 connecting the first chip 130 and the carrier 140, there is usually provided an encapsulation 180, such as an underfill material, in the gap between the carrier 140 and the first chip 130. In order to have stud bumps 160 formed on the first back surface 132 of the first chip 130, the first back surface 132 of the first chip 130 is not covered by the encapsulation 180 and the first back surface 132 is exposed out of the encapsulation 180. However, there may be provided an encapsulation 180, such as a thermosetting compound, to cover the first chip 130 and the second chip 190 after the second chip 190 is stacked to the first chip 130 by utilizing a transfer molding method. In this embodiment, the second chip 190 is exposed out of the encapsulation 180 to enhance the thermal performance of the stacked package module as shown in FIG. 5. To be noted, in order to protect the circuits layer formed on the first back surface 132 of the first chip 130 from being damage due to oxidation, there is provided a passivation layer covering the circuits layer and leaves a portion of the circuits layer 134 to be regarded as terminals for forming stud bumps 160 thereon. Furthermore, the circuits layer 134 may comprise anti-oxidation layer, such as an aluminum layer, a nickel-vanadium layer, and gold layer and so on. Moreover, as shown in FIG. 6, there is also provided a heat sink 195 formed on the second back surface 192 of the second chip 190 to further enhance the thermal performance of the package module.

Figure 7:
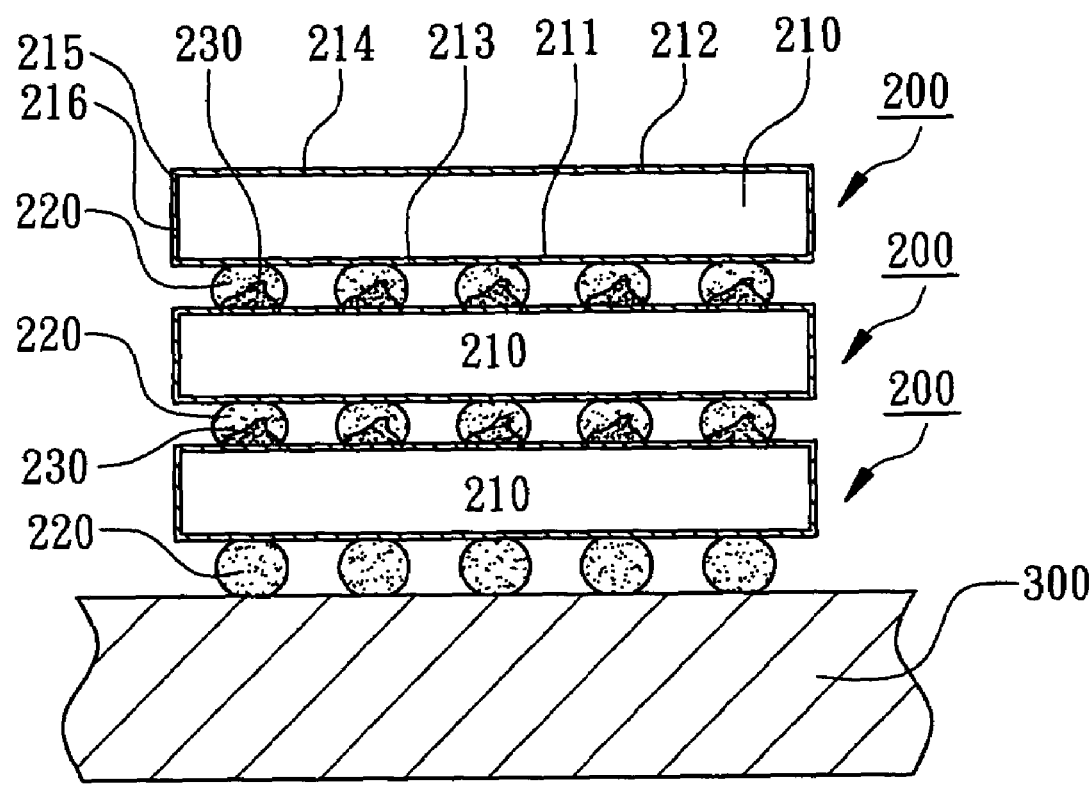
FIG. 7 is a cross-sectional view of a stacked package module according to another preferred embodiment of the present invention.

Referring to FIG. 7, it illustrates another embodiment of this invention. A stacked package module has a plurality of semiconductor devices stacked with each other in a vertical direction. In this embodiment, each device 200 has a chip 210, a plurality of solder bumps 220 and a plurality of stud bumps 230. Therein, the chip 210 has an active surface 211 and a back surface 212 opposing to the active surface 211. Furthermore, the active surface 211 has a first circuits layer 213 and a passivation layer (not shown); the back surface 212 has a second circuits layer 214; and there are a plurality of side circuits layer 215, formed on a side surface 216, electrically connecting the first circuits layer and the second circuits layer 214. To be noted, the side circuits layer 215 can be made by penetrating the chip 210 through laser to form a through hole and then have meal layer plated on the wall of the through hole and disposing insulation material in the through hole. Moreover, the solder bumps 220 are formed on the active surface 211 of the chip 210 and electrically connected to the first circuits layer 213; and the stud bumps 230 are formed on the back surface 212 of the chip 210 and electrically connected to the second circuits layer 214. As mentioned in the above-mentioned embodiment, the melting point of solder bumps 220 are lower than that of stud bumps 230, such as gold bumps or copper bumps. In such a manner, when the solder bumps 220 are reflowed, the stud bumps 230 are encapsulated and the attachment of the solder bumps 220 to the stud bumps 230 are enhanced. Thus, the reliability of stacked package module will be increased and the requirement for a smaller stacked package module will be met.

Although the invention has been described in considerable detail with reference to certain preferred embodiments, it will be appreciated and understood that various changes and modifications may be made without departing from the spirit and scope of the invention as defined in the appended claims.

What is claimed is:

1. A stacked package module, comprising:
a first chip, the first chip having a first active surface, a first back surface opposing to the first active surface and a side surface connecting the first active surface and the first back surface;
a circuits layer formed directly on the first back surface and extended along the side surface and the first active surface so as to electrically connect to the first back surface and the first active surface;
a plurality of stud bumps made of a first material, the stud bumps formed on the first back surface and electrically connected to the circuits layer, wherein the stud bumps have a bump body and a trail protruded from the bump body; and
a second chip, the second chip having a second active surface connected to the stud bumps, wherein the second chip has a plurality of second bumps made of a second material different than the first material formed on the second active surface and electrically connected to the circuits layer through the stud bumps by completely encapsulating the stud bumps with the second bumps.

2. The stacked package module of claim 1, further comprising a plurality of first bumps formed on the first active surface and a carrier attached to the first bumps.

3. The stacked package module of claim 2, wherein the carrier is a leadless lead frame.

4. The stacked package module of claim 1, further comprising an encapsulation encapsulating the first bumps.

5. The stacked package module of claim 4, wherein the first back surface is exposed out of the encapsulation.

6. The stacked package module of claim 4, wherein the encapsulation is an underfill.

7. The stacked package module of claim 1, wherein the second bumps are solder bumps and encapsulating the stud bumps respectively.

8. The stacked package module of claim 1, wherein the stud bumps are gold bumps.

9. The stacked package module of claim 1, wherein the second back surface has a protection layer formed thereon.

10. The stacked package module of claim 1, wherein the circuits layer comprises aluminum layer and gold layer.

11. The stacked package module of claim 1, wherein the circuits layer comprises titanium layer, copper layer, nickel layer and gold layer.

12. The stacked package module of claim 1, further comprising an anti-oxidized layer formed on a portion of the circuits layer wherein the stud bumps are exposed out of the anti-oxidized layer.

13. The stacked package module of claim 1, further comprising a molding compound encapsulating the first chip, the second chip, the stud bumps, the first bumps and the second bumps.

14. The stacked package module of claim 13, wherein the second back surface are exposed out of the molding compound.

15. The stacked package module of claim 14, further comprising a heat sink disposed over the second chip.

16. The stacked package module of claim 1, wherein the stud bumps have a bump body and a trail protruded from the bump body prior to being connected to the second active surface of the second chip.

* * * * *